United States Patent
Saito et al.

(10) Patent No.: US 10,796,768 B2
(45) Date of Patent: Oct. 6, 2020

(54) SEMICONDUCTOR MEMORY DEVICE

(71) Applicant: RENESAS ELECTRONICS CORPORATION, Tokyo (JP)

(72) Inventors: Tomoya Saito, Tokyo (JP); Naoki Takizawa, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 0 days.

(21) Appl. No.: 16/352,273

(22) Filed: Mar. 13, 2019

(65) Prior Publication Data
US 2019/0304544 A1 Oct. 3, 2019

(30) Foreign Application Priority Data
Mar. 30, 2018 (JP) .................................. 2018-067217

(51) Int. Cl.
| | | |
|---|---|---|
| G11C 11/34 | (2006.01) | |
| G11C 16/04 | (2006.01) | |
| G11C 16/14 | (2006.01) | |
| G11C 16/26 | (2006.01) | |

(52) U.S. Cl.
CPC .......... *G11C 16/14* (2013.01); *G11C 16/0441* (2013.01); *G11C 16/26* (2013.01)

(58) Field of Classification Search
CPC ...... G11C 16/14; G11C 16/0441; G11C 16/26
See application file for complete search history.

(56) References Cited

U.S. PATENT DOCUMENTS

| | | | |
|---|---|---|---|
| 7,646,642 B2 | 1/2010 | Fujito et al. | |
| 9,025,386 B1* | 5/2015 | Iyer ..................... | G11C 11/5671 365/185.18 |
| 9,418,745 B1* | 8/2016 | Chen .................... | G11C 16/14 |
| 2012/0033495 A1* | 2/2012 | Kato .................... | G11C 16/344 365/185.05 |
| 2015/0348981 A1* | 12/2015 | La Rosa ............ | G11C 16/0433 365/185.29 |
| 2015/0349967 A1* | 12/2015 | Chen ..................... | H04L 9/3278 713/193 |
| 2016/0203328 A1* | 7/2016 | Sawada ................... | G06F 21/85 726/26 |
| 2016/0260486 A1* | 9/2016 | Tani ..................... | G11C 16/14 |
| 2018/0277214 A1* | 9/2018 | Kurafuji ............ | G11C 16/0441 |

FOREIGN PATENT DOCUMENTS

JP   2008-117510 A   5/2008

* cited by examiner

*Primary Examiner* — Toan K Le
(74) *Attorney, Agent, or Firm* — McDermott Will & Emery LLP

(57) ABSTRACT

It is to optimize the initial threshold voltages of each memory area in a semiconductor memory device including a plurality of memory areas. A semiconductor memory device according to the embodiment includes a first memory area for storing data and a second memory area for storing the information related to the first memory area. In the respective memory cells arranged in the first and the second memory areas, the initial threshold voltages of the memory cells arranged in the second memory area are designed to be higher than those of the memory cells arranged in the first memory area.

12 Claims, 10 Drawing Sheets

DATA INDEFINITE
(ERASED STATE)

DATA "0"

DATA "1"

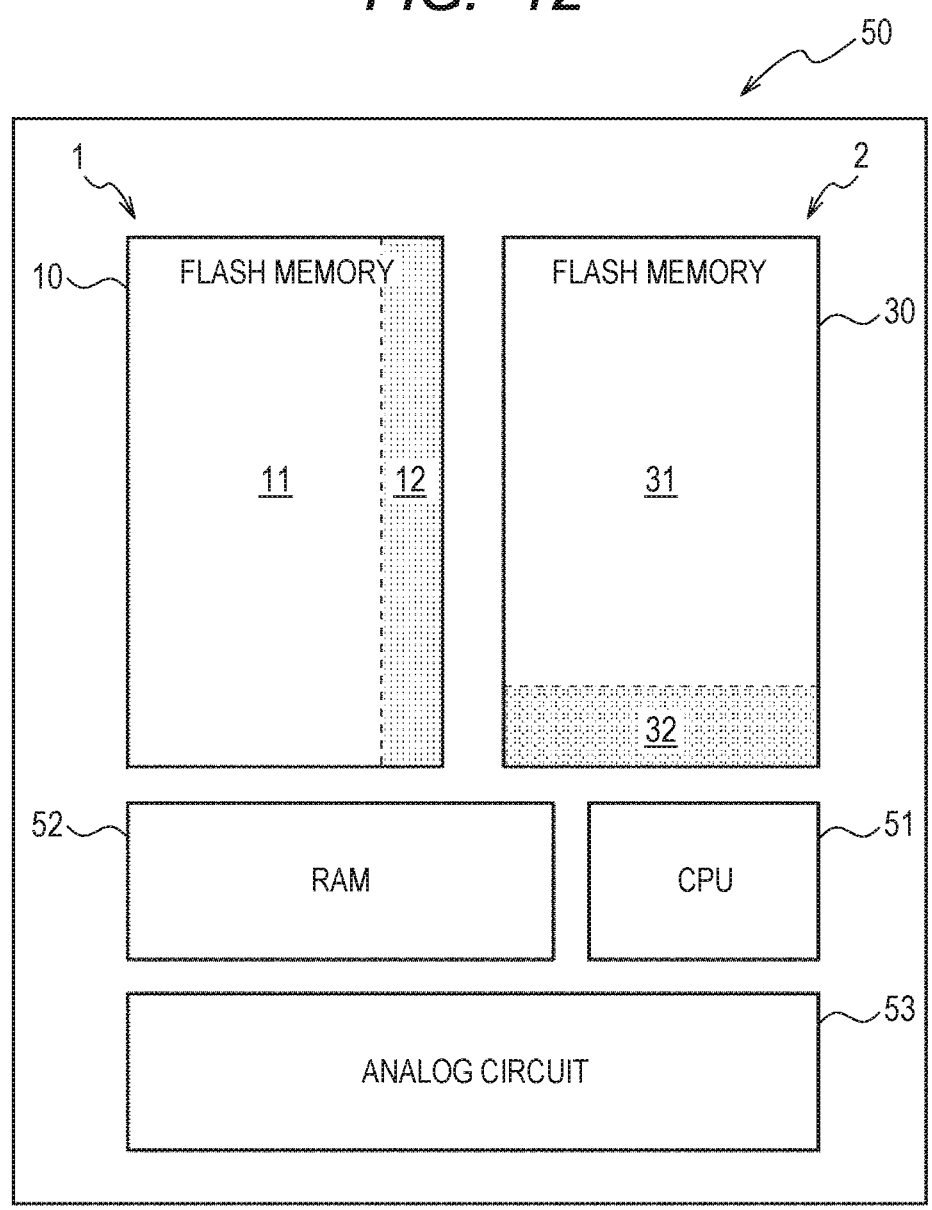

SEMICONDUCTOR MEMORY DEVICE

CROSS-REFERENCE TO RELATED APPLICATIONS

The disclosure of Japanese Patent Application No. 2018-067217 filed on Mar. 30, 2018 including the specification, drawings and abstract is incorporated herein by reference in its entirety.

BACKGROUND

The invention relates to a semiconductor memory device, for example, a semiconductor memory device including a plurality of memory areas.

Japanese Unexamined Patent Application Publication No. 2008-117510 discloses a flash memory according to a complementary read method. In the flash memory according to the complementary read method, two rewritable nonvolatile memory cells are defined as a pair and one bit information is stored in the pair of the memory cells (twin cells). Each memory cell forming the twin cells is in either a low threshold voltage state or a high threshold voltage state. In the flash memory according to the complementary read method, the two memory cells forming the twin cells are made into the different threshold voltage states, to store one bit information.

SUMMARY

A semiconductor memory device includes a flag area and an extra area for storing information necessary for the operation of the semiconductor memory device, in addition to the data area for storing data. For example, a status flag indicating the state of the data stored in the data area is stored in the flag area. Further, for example, the information necessary for initially stating the semiconductor memory device (trimming code and the like) is stored in the extra area.

As mentioned above, a semiconductor memory device is provided with a plurality of memory areas, and the importance of the data stored in these memory areas, each reading timing therefrom, and the like are various. In the semiconductor memory device such as a flash memory and the like, information is stored using the state of a threshold voltage (low threshold voltage state or high threshold voltage state) in each memory cell; when the semiconductor memory device includes a plurality of memory areas, it is necessary to optimize each initial threshold voltage in each memory area, considering the using state of each memory area.

Other objects and novel characteristics will be apparent from the description of the specification and the attached drawings.

A semiconductor memory device according to one embodiment includes a first memory area and a second memory area, in which the initial threshold voltages of the memory cells arranged in the second memory area are formed to be higher than those of the memory cells arranged in the first memory area, as for the respective memory cells arranged in the first and the second memory areas.

According to the embodiments, it is possible to optimize each initial threshold voltage in each memory area, in the semiconductor memory device including a plurality of memory areas.

DETAILED DESCRIPTION OF DRAWINGS

Figure 3C:
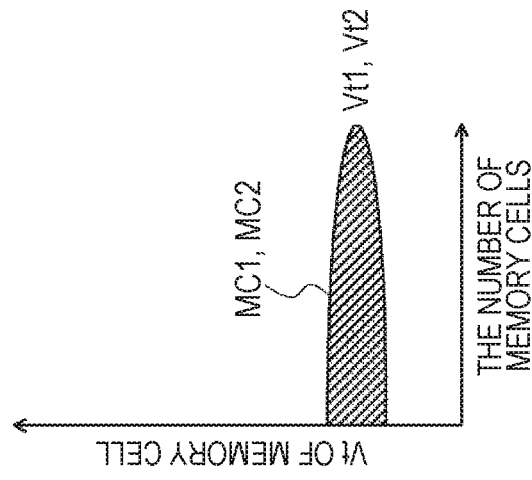
Figure 3B:
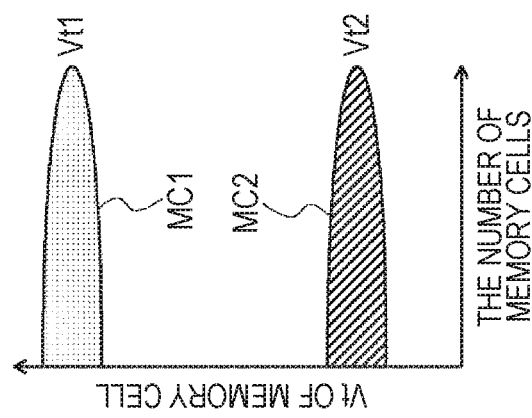
Figure 3A:
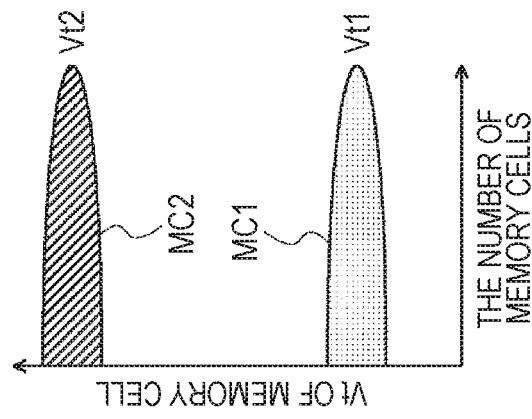

FIGS. 3A, 3B, and 3C are views each showing distribution of the threshold voltages Vt1 and Vt2 of the memory cells MC1 and MC2 forming the twin cells. FIG. 3A shows the state with the data "1" stored, FIG. 3B shows the state with the data "0" stored, and FIG. 3C shows the data indefinite state.

Figure 4:
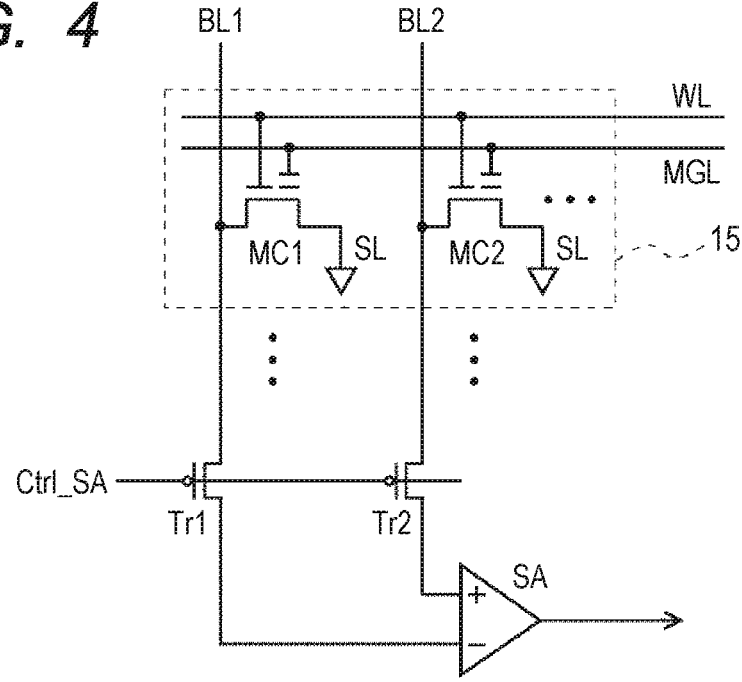

FIG. 4 is a view for use in describing a structural example of the twin cells arranged in a data area and the read operation.

Figure 5:
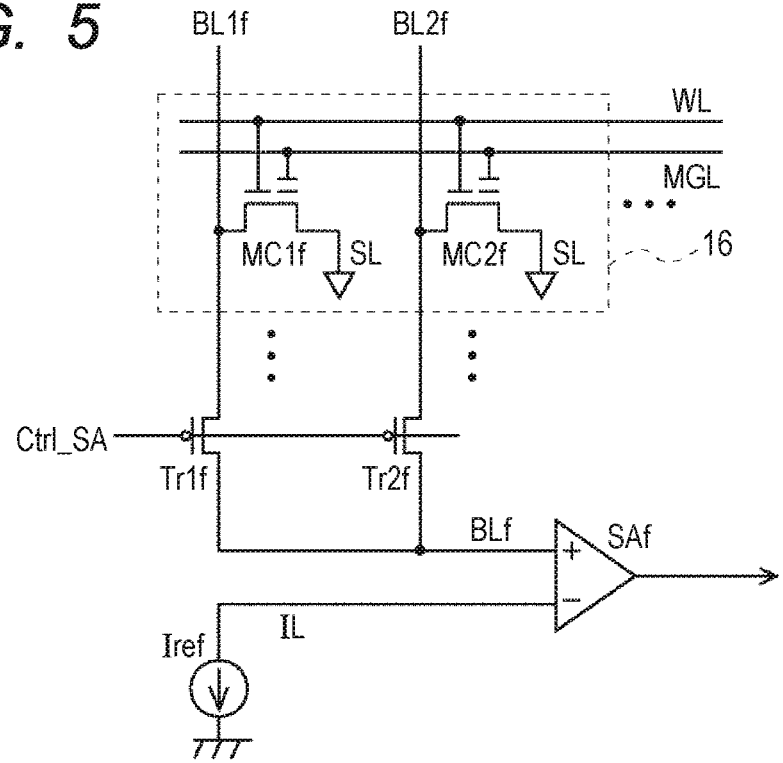

FIG. 5 is a view for use in describing a structural example of a plurality of memory cells arranged in a flag area and the read operation.

Figure 6:
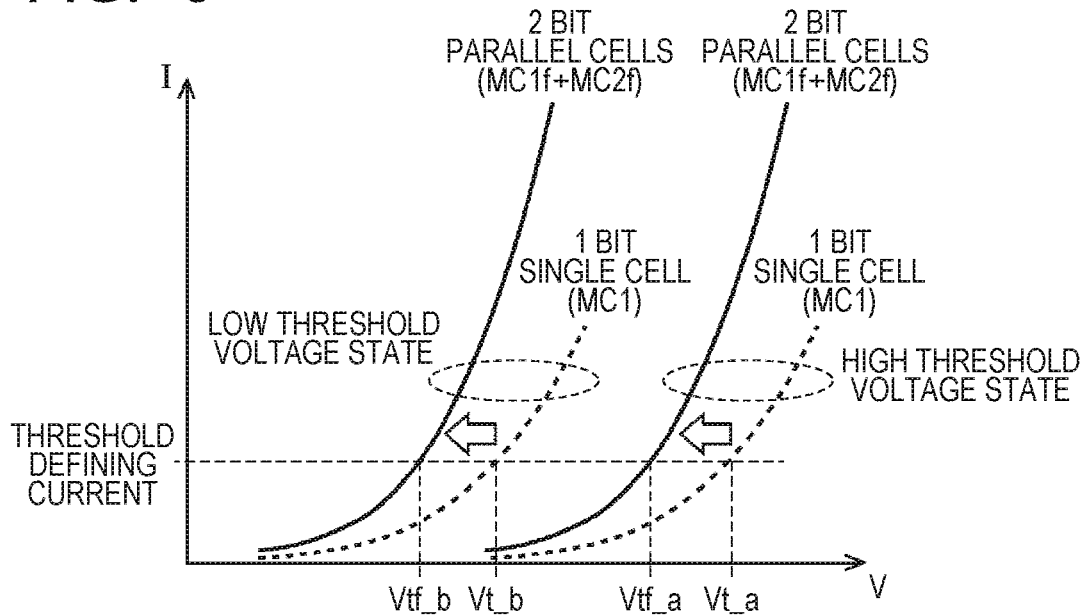

FIG. 6 is a graph showing the I-V characteristics in reading the respective memory cells (the case of not adjusting the initial threshold voltages).

Figure 7:
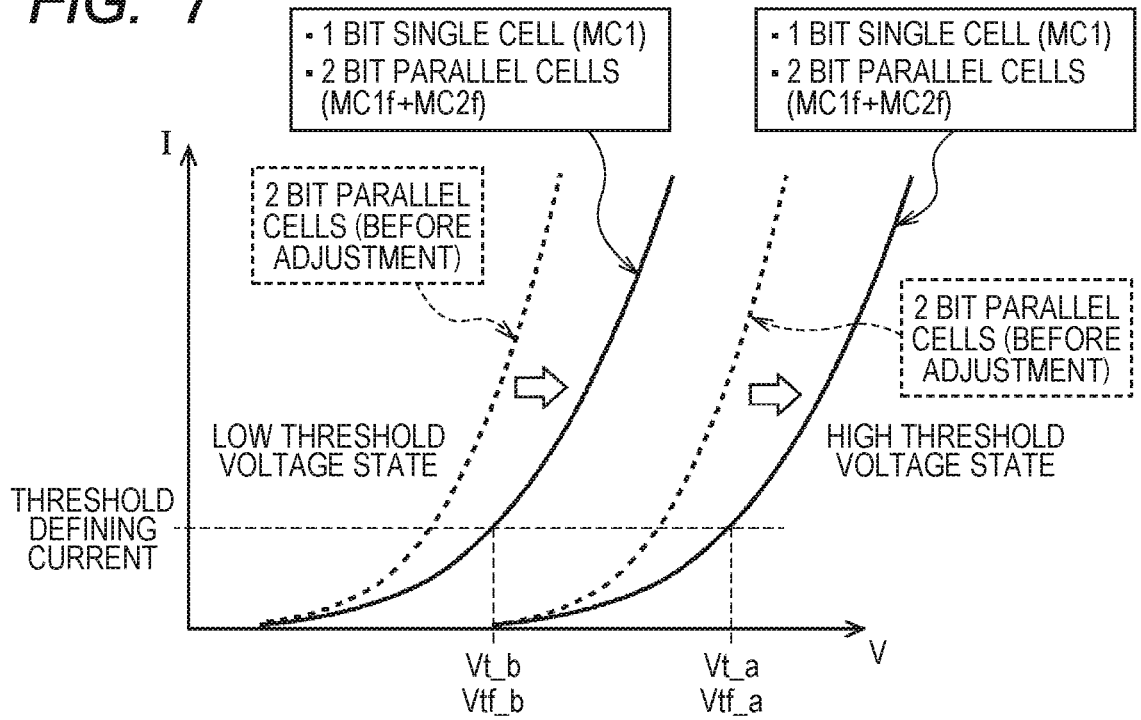

FIG. 7 is a graph showing the I-V characteristics in reading the respective memory cells (the case of adjusting the initial threshold voltages).

Figure 8:
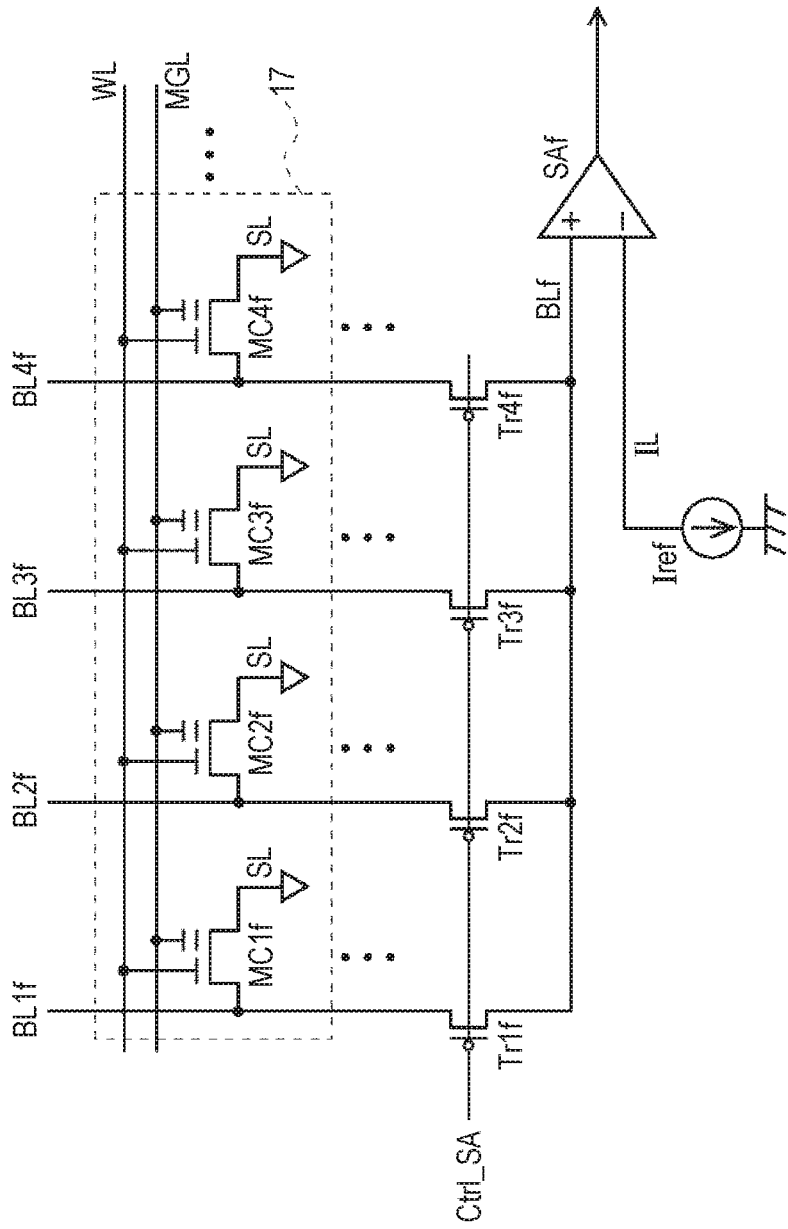

FIG. 8 is a view showing another structural example of the plural memory cells arranged in the flag area.

Figure 9:
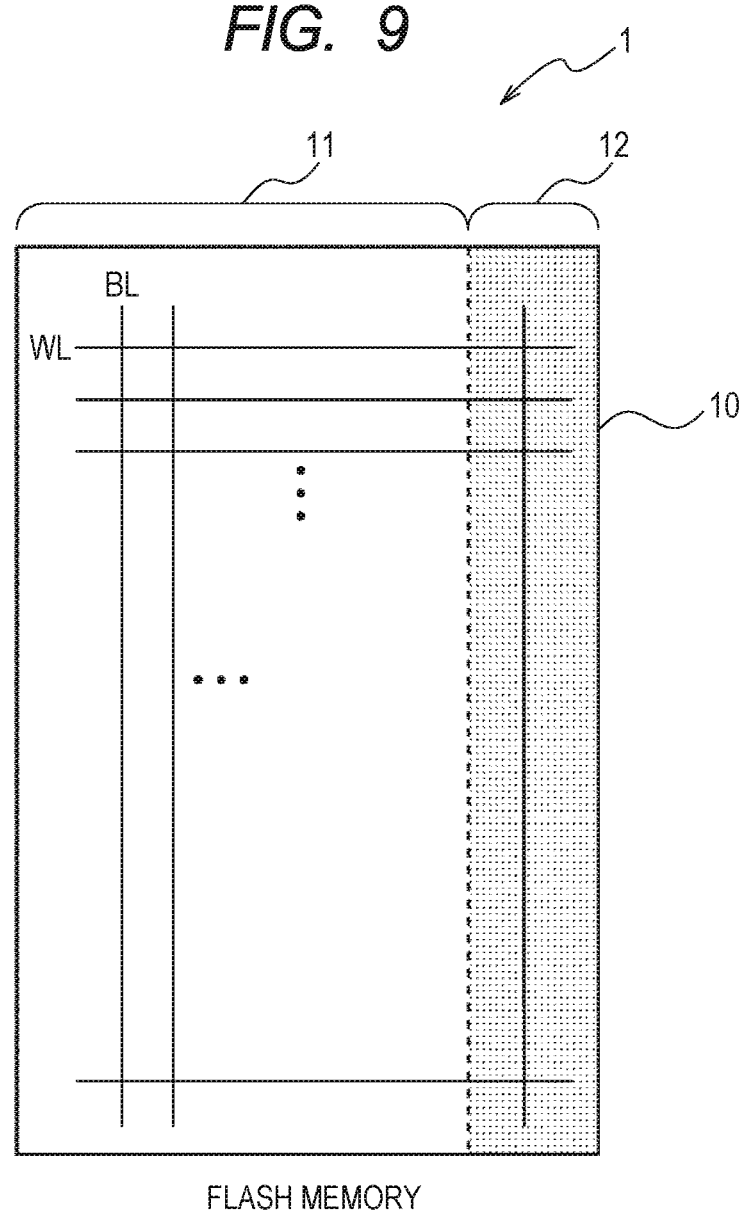

FIG. 9 is a view showing the whole structure of the semiconductor memory device according to the first embodiment.

Figure 10:
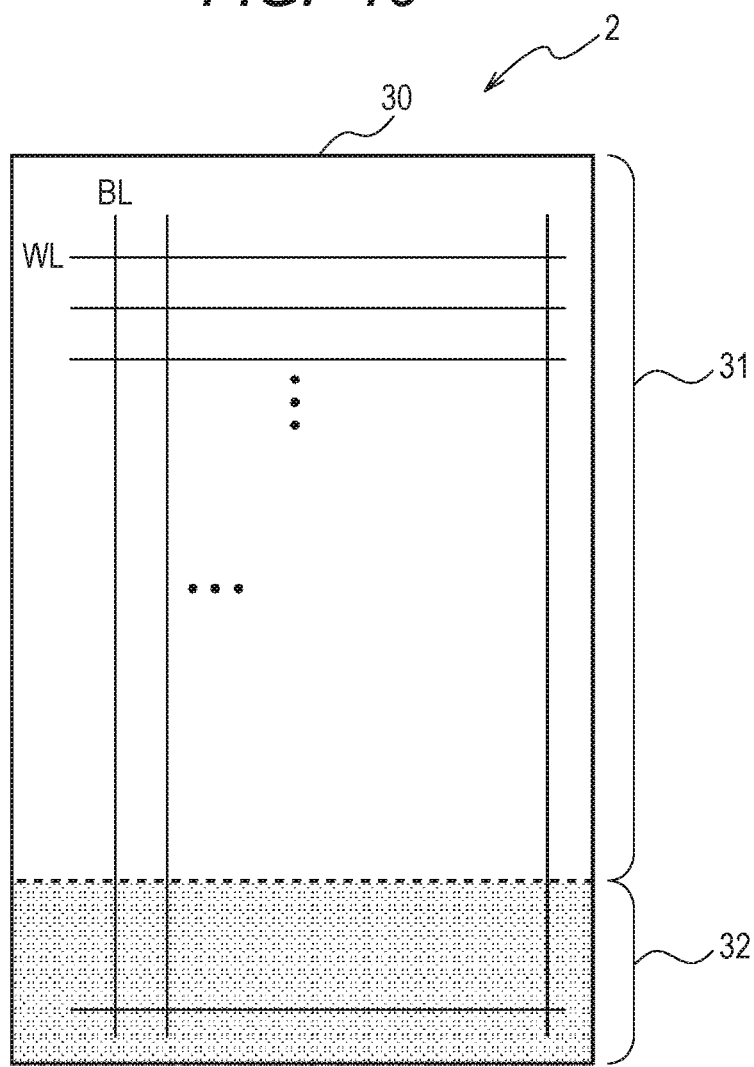

FIG. 10 is a view showing the whole structure of a semiconductor memory device according to a second embodiment.

Figure 11:
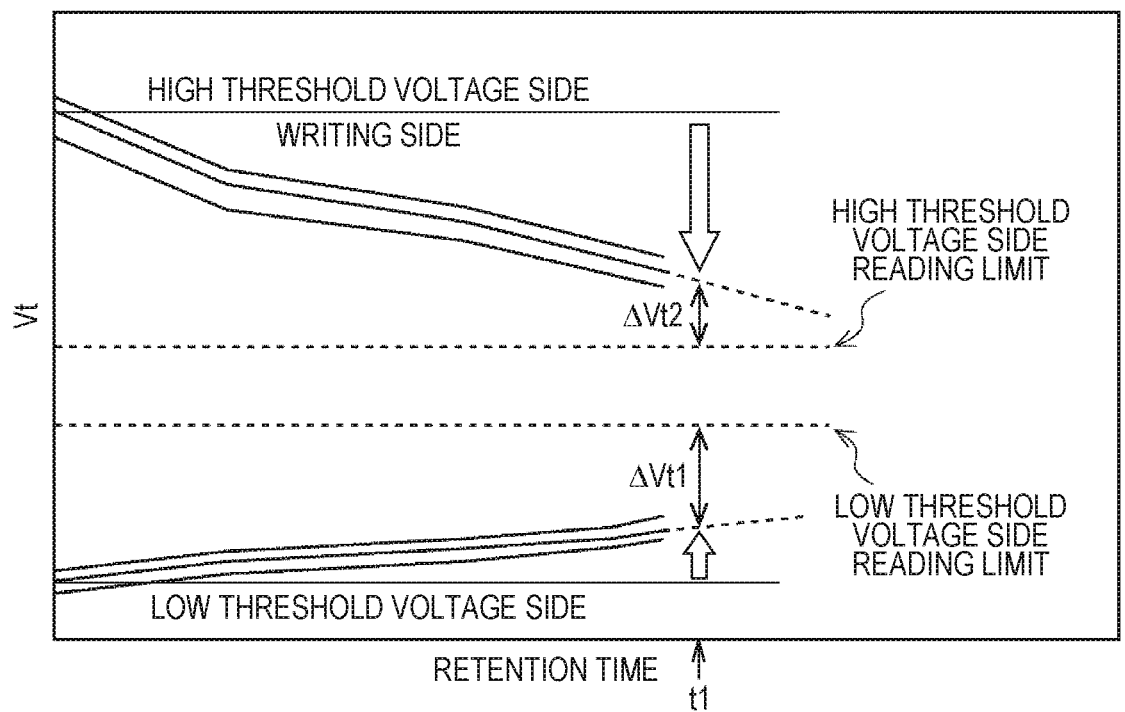

FIG. 11 is a graph showing a relation between a retention time and Vt of a memory cell when the memory cell is left under the environment of 160° C.

FIG. 12 is a block diagram showing an example of mounting the semiconductor memory devices according to the first and second embodiments.

DETAILED DESCRIPTION

At first, the outline of a semiconductor memory device according to embodiments will be described.

The semiconductor memory device according to the embodiments is, for example, a nonvolatile memory such as a flash memory and the like. The semiconductor memory device according to the embodiments includes a first memory area of storing data and a second memory area of storing the information related to the first memory area. The respective memory cells arranged in the first and the second memory areas are formed in that the initial threshold voltage of the memory cell arranged in the second memory area is higher than the initial threshold voltage of the memory cell arranged in the first memory area.

The semiconductor memory device according to the embodiments optimizes the initial threshold voltage in each memory area, by making the initial threshold voltage of the memory cell arranged in the second memory area higher than that of the memory cell arranged in the first memory area. Here, the "initial threshold voltage" corresponds to a threshold voltage of a memory cell after a semiconductor memory device is manufactured. Further, the "initial threshold voltage" also corresponds to a threshold voltage of a memory cell in a state with no electric charge accumulated in its charge holding area. This state is also referred to as a neutral threshold state.

In the above structure, the first memory area is a data area where data is stored. Further, the second memory area is a flag area and an extra area where the information related to the first memory area is stored. For example, a status flag indicating the state of the data stored in the data area is stored in the flag area. Further, for example, the information for operating the first memory area (trimming code and the like), in short, the information necessary for starting the semiconductor memory device initially is stored in the extra area.

As described later, a structural example of a semiconductor memory device in which the second memory area is the flag area will be described in a first embodiment. Further, a structural example of a semiconductor memory device in which the second memory area is the extra area will be described in a second embodiment. The structures shown in the first and the second embodiments described later are only one example and the invention is not restricted to the structures shown in the first and the second embodiments as far as it is a semiconductor memory device having the initial threshold voltage of a memory cell arranged in the second memory area higher than that of a memory cell arranged in the first memory area.

First Embodiment

A first embodiment will be described with reference to the drawings.

Figure 1:
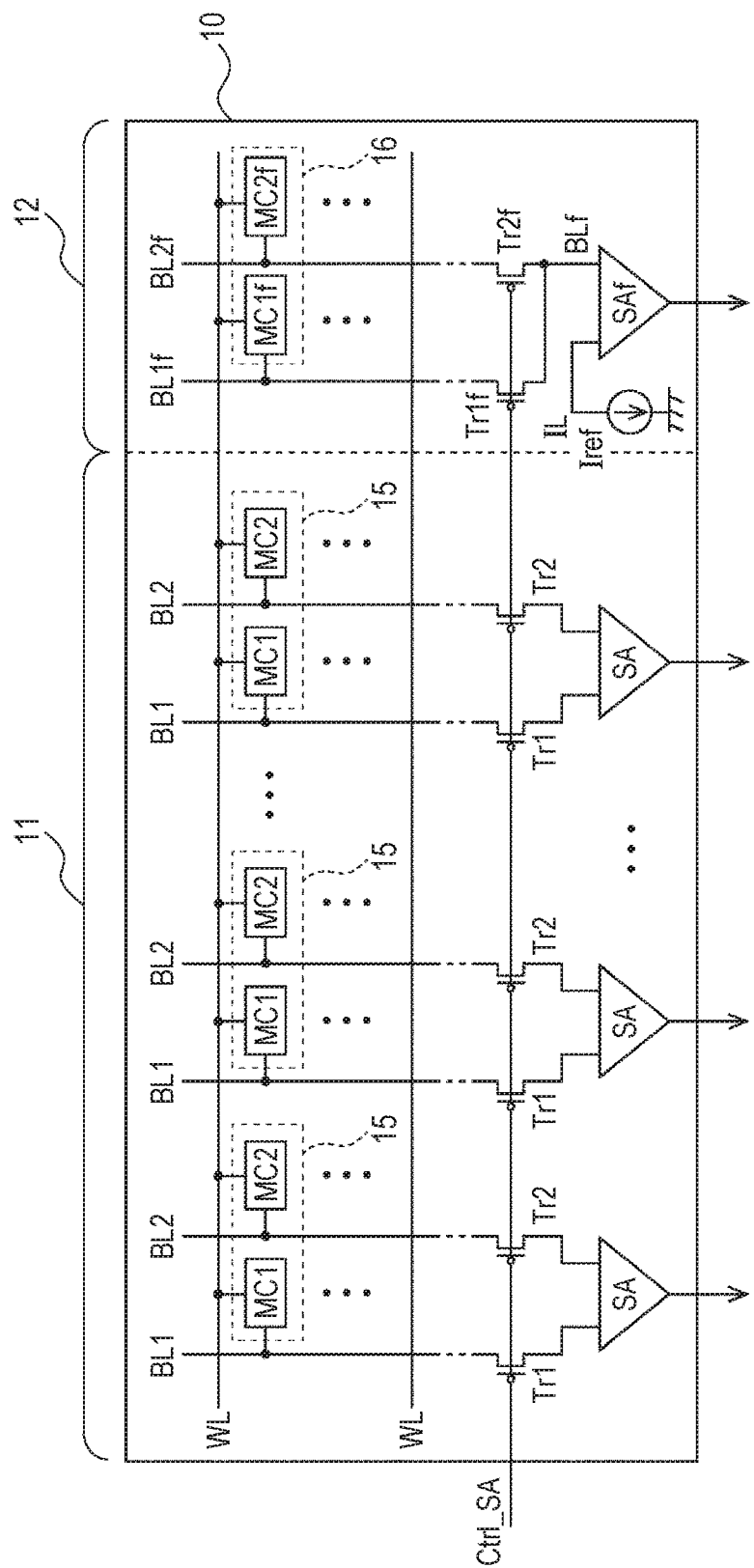
FIG. 1 is a block diagram showing a structural example of a semiconductor memory device according to a first embodiment.

FIG. 1 is a block diagram showing a structural example of a semiconductor memory device according to the first embodiment. As shown in FIG. 1, a semiconductor memory device 1 according to the embodiment includes a memory array 10. The memory array 10 includes a data area 11 (first memory area) and a flag area 12 (second memory area).

Data is stored in the data area 11. Specifically, plural pairs 15 of the memory cells (hereinafter, also referred to as twin cells 15) each consisting of a memory cell MC1 and a memory cell MC2 are arranged in the data area 11. The memory cell MC1 is coupled to the word line WL and the bit line BL1 and the memory cell MC2 is coupled to the word line WL and the bit line BL2.

A plurality of sense amplifiers SA is arranged at a side of the end portion (lower side) in an extending direction of the bit lines BL1 and BL2 in the memory array 10. The bit line BL1 is coupled to one input terminal of the sense amplifier SA through a transistor Tr1. The bit line BL2 is coupled to the other input terminal of the sense amplifier SA through a transistor Tr2. A control signal Ctrl_SA for controlling the connection of the bit lines BL1 and BL2 to the sense amplifier SA is supplied to the gates of the transistors Tr1 and Tr2. In the structural example shown in FIG. 1, the transistors Tr1 and Tr2 are formed by a P-type transistor; when the control signal Ctrl_SA is a low level, the bit lines BL1 and BL2 are coupled to the sense amplifier SA, and when the control signal Ctrl_SA is a high level, the bit lines BL1 and BL2 are cut off from the sense amplifier SA.

In the data area 11, one bit data is stored in the twin cells 15 consisting of the memory cell MC1 and the memory cell MC2. The data stored in the twin cells 15 is read out according to the complementary read method.

Figure 2:
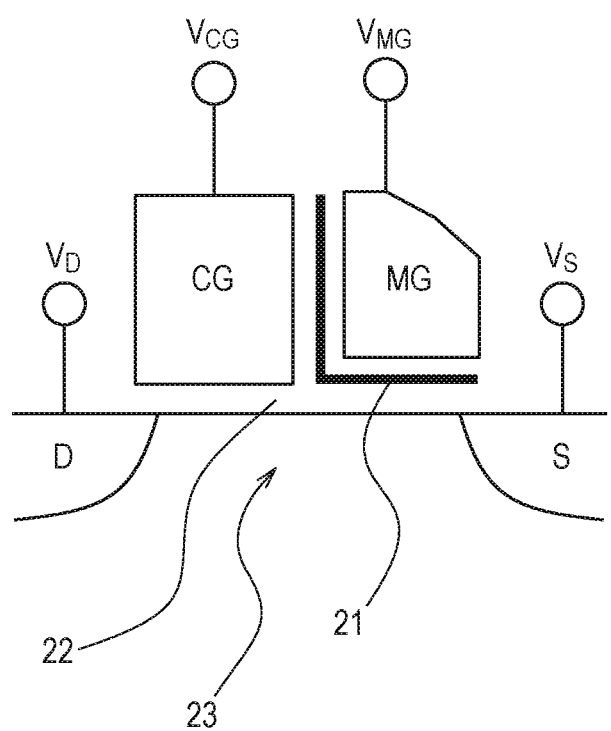
FIG. 2 is a view showing a structural example of a memory cell included in the semiconductor memory device according to the first embodiment.

FIG. 2 is a view showing a structural example of the memory cells MC1 and MC2 included in the semiconductor memory device according to the embodiment. As shown in FIG. 2, each of the memory cells MC1 and MC2 includes a source region S, a drain region D, a channel forming region 23 between the source region S and the drain region D, a control gate CG, a memory gate MG, a charge trap region 21, and a gate insulating film 22. The control gate CG and the memory gate MG are formed above the channel forming region 23 through the gate insulating film 22. The charge trap region 21 is formed between the memory gate MG and the channel forming region 23. The charge trap region 21 is formed by using, for example, silicon nitride and the like. As shown in FIG. 2, the memory cells MC1 and MC2 are split gate type flash memory cells (for example, SG-MONOS).

As shown in FIGS. 1 and 2, the respective drain regions D of the memory cells MC1 and MC2 are coupled to the respective bit lines BL1 and BL2, each source region S is coupled to the source line SL, each control gates CG is coupled to the word line WL, and each memory gate MG is coupled to a memory gate select line MGL (not shown in FIG. 1).

In the structural example of the memory cells MC1 and MC2 shown in FIG. 2, the threshold voltages Vt1 and Vt2 of the memory cells MC1 and MC2 change respectively according to the amount of electrons trapped by the charge trap regions 21 in the memory cells MC1 and MC2. Specifically, when the amount of the electrons trapped by the charge trap regions 21 in the memory cells MC1 and MC2 is large, the threshold voltages Vt1 and Vt2 rise. On the contrary, when the amount of the electrons trapped by the charge trap regions 21 in the memory cells MC1 and MC2 is small, the threshold voltages Vt1 and Vt2 fall.

To raise the threshold voltages Vt1 and Vt2 of the memory cells MC1 and MC2, for example, each voltage value of the memory cells MC1 and MC2 is set as $V_D=0$ V, $V_{CG}=1.5$ V, $V_{MG}=10$ V, and $V_{SL}=6$ V. By setting each value as mentioned above, write current flows from the source region S to the drain region D, hot electron generated in the boundary portion between the control gate CG and the memory gate MG is injected into the charge trap region 21, and then, the threshold voltages Vt1 and Vt2 of the memory cells MC1 and MC2 are raised. This state is sometimes referred to as "high threshold voltage state" and "writing state".

On the other hand, to lower the threshold voltages Vt1 and Vt2 of the memory cells MC1 and MC2, for example, each voltage of the memory cells MC1 and MC2 is set as $V_D=0$ V, $V_{CG}=0$ V, $V_{MG}=-10$ V, and $V_{SL}=6$ V. By setting each voltage as mentioned above, a high electric field is applied between the SL junction and the memory gate MG and a hot hole is generated according to the band to band tunneling (BtoB). The hot hole is injected into the charge trap region 21 and the threshold voltages Vt1 and Vt2 of the memory cells MC1 and MC2 are lowered. This state is sometimes referred to as "low threshold voltage stage" and "erased state".

When reading out data from the memory cells MC1 and MC2, each value of the memory cells MC1 and MC2 is set, for example, as $V_D=1.5$ V, $V_{CG}=1.5$ V, $V_{MG}=0$ V, and $V_{SL}=0$ V. By setting each voltage as mentioned above, when the threshold voltages Vt1 and Vt2 of the memory cells MC1 and MC2 are low, the memory cells MC1 and MC2 become the ON state (current easily flowing state); while when the threshold voltages Vt1 and Vt2 of the memory cells MC1 and MC2 are high, the memory cells MC1 and MC2 become the OFF state (current hardly flowing state).

In the semiconductor device according to the embodiment, the respective voltages $V_D$, $V_{CG}$, $V_{MG}$, and $V_{SL}$ of each of the memory cells MC1 and MC2 are set as shown in the above, only by way of example, and any other set values may be used. Further, the structure of each of the memory cells MC1 and MC2 shown in FIG. 2 is only one example, and the memory cell of any other structure than the structure shown in FIG. 2 may be used in the semiconductor memory device according to the embodiment.

FIGS. 3A, 3B, and 3C are graphs each showing the distribution of the threshold voltages Vt1 and Vt2 of the memory cells MC1 and MC2 forming the twin cells 15. The twin cells 15 are formed to be able to hold the data defined according to the size relation between the threshold voltage Vt1 of the memory cell MC1 and the threshold voltage Vt2 of the memory cell MC2.

For example, as shown in FIG. 3A, when the threshold voltage Vt2 of the memory cell MC2 is higher than the threshold voltage Vt1 of the memory cell MC1, data "1" is written in the twin cells 15. In short, when the threshold voltage Vt1 of the memory cell MC1 is in the low threshold voltage state and the threshold voltage Vt2 of the memory cell MC2 is in the high threshold voltage state, the data "1" is written in the twin cells 15.

On the contrary, as shown in FIG. 3B, when the threshold voltage Vt1 of the memory cell MC1 is higher than the threshold voltage Vt2 of the memory cell MC2, the data "0" is written in the twin cells 15. In short, when the threshold voltage Vt1 of the memory cell MC1 is in the high threshold voltage state and the threshold voltage Vt2 of the memory cell MC2 is in the low threshold voltage state, the data "0" is written in the twin cells 15.

Here, the low threshold voltage state means that the threshold voltage of the transistor (refer to FIG. 2) forming the memory cell is less than a predetermined reference value. The high threshold voltage state means that the threshold voltage of the transistor forming the memory cell is a predetermined reference value and more.

Further, the memory cell MC1 is sometimes referred to as "positive memory" and the memory cell MC2 is sometimes referred to as "negative memory". Further, in the embodiment, a relation between the threshold voltages Vt1 and Vt2 of the memory cells MC1 and MC2 and the data of the twin cells 15 ("1" or "0" state) may be defined as the relation contrary to the case shown in FIG. 3. Concretely, when the threshold voltage Vt1 of the memory cell MC1 is higher than the threshold voltage Vt2 of the memory cell MC2, the data "1" may be written in the twin cells 15. When the threshold voltage Vt2 of the memory cell MC2 is higher than the threshold voltage Vt1 of the memory cell MC1, the data "0" may be written in the twin cells 15.

As shown in FIG. 3C, when the threshold voltage Vt1 of the memory cell MC1 and the threshold voltage Vt2 of the memory cell MC2 are both in the low threshold voltage state, they are in the erased state (initializing state). In the case of the erased state, the reading result from the twin cells gets indefinite. In other words, depending on the size relation between the threshold voltages Vt1 and Vt2, the read value may be "1" or "0" and it is not fixed to a unique value.

FIG. 4 is a view for use in describing the structural example of the twin cells 15 arranged in the data area and the read operation. As shown in FIG. 4, the drain region D (referred to FIG. 2) in the memory cell MC1 is coupled to the bit line BL1, the source region S is coupled to the source line SL, the control gate CG is coupled to the word line WL, and the memory gate MG is coupled to the memory gate select line MGL. Further, the drain region D in the memory cell MC2 is coupled to the bit line BL2, the source region S is coupled to the source line SL, the control gate CG is coupled to the word line WL, and the memory gate MG is coupled to the memory gate select line MGL.

Data can be written in the memory cells MC1 and MC2 and data can be read from the memory cells MC1 and MC2 according to a memory control circuit (not illustrated). Concretely, by controlling the bit lines BL1 and BL2, the word line WL, the memory gate select line MGL, and the source line SL, according to the memory control circuit (not illustrated), data can be written into the memory cells MC1 and MC2 and data can be read from the memory cells MC1 and MC2.

Hereinafter, the data read operation will be described in details. The state of the threshold voltages Vt1 and Vt2 of the memory cells MC1 and MC2, in short, the data stored in the twin cells 15 is read using the sense amplifier SA provided in the data area 11. Here, the data stored in the twin cells 15 is read according to the complementary read method.

Specifically, the bit line BL1 coupled to the memory cell MC1 and the bit line BL2 coupled to the memory cell MC2 are precharged to have a predetermined voltage (for example, $V_D$=1.5 V). Then, with the word line WL turned into a high level state, the voltages of the control gates in the memory cells MC1 and MC2 are turned into a high level (for example, $V_{CG}$=1.5 V). According to this, the current depending on the threshold voltage state in the memory cell MC1 flows in the memory cell MC1 and the bit line BL1 is discharged. Similarly, the current depending on the threshold voltage state in the memory cell MC2 flows in the memory cell MC2 and the bit line BL2 is discharged. At a predetermined sense timing, a voltage difference between the bit line BL1 and the bit line BL2 is sensed by using the sense amplifier SA, hence to be able to detect the data stored in the twin cells 15.

Specifically, when the threshold voltage Vt1 of the memory cell MC1 is low and the threshold voltage Vt2 of the memory cell MC2 is high, the current easily flows in the memory cell MC1 and the current hardly flows in the memory cell MC2. In this case, the voltage of the bit line BL1 is lower than the voltage of the bit line BL2. The sense amplifier SA detects the potential difference between the bit lines BL1 and BL2, which makes it possible to determine that the data "1" is stored in the twin cells 15.

On the contrary, when the threshold voltage Vt1 of the memory cell MC1 is high and the threshold voltage Vt2 of the memory cell MC2 is low, the current hardly flows in the memory cell MC1 and the current easily flows in the memory cell MC2. In this case, the voltage of the bit line BL1 is higher than the voltage of the bit line BL2. The sense amplifier SA detects the potential difference between the bit lines BL1 and BL2, which makes it possible to determine that the data "0" is stored in the twin cells 15.

Next, the flag area 12 of the memory array 10 included in the semiconductor memory device 1 shown in FIG. 1 will be described. The flag area 12 stores the status flag indicating the state of the data stored in the data area 11. A plurality of memory cells 16 is arranged in the flag area 12. A memory cell MC1$f$ of the plural memory cells 16 is coupled to the word line WL and the bit line BL1$f$, and a memory cell MC2$f$ is coupled to the word line WL and the bit line BL2. The memory cells MC1$f$ and MC2$f$ arranged in the flag area 12 can be formed by using the memory cell shown in FIG. 2.

A sense amplifier SAf is arranged at a side of the end portion (lower side) in an extending direction of the bit lines BL1$f$ and BL2$f$ in the memory array 10. One input terminal of the sense amplifier SAf is coupled to a bit line BLf where the memory cells MC1$f$ and MC2$f$ are coupled in parallel, and the other input terminal is coupled to a reference current source Iref. Specifically, a bit line BL1$f$ is coupled to the bit line BLf through a transistor Tr1$f$. A bit line BL2$f$ is coupled to the bit line BLf through a transistor Tr2$f$. The bit line BLf is coupled to the one input terminal of the sense amplifier SAf.

The control signal Ctrl_SA for controlling the connection of the bit lines BL1$f$ and BL2$f$ to the sense amplifier SAf is supplied to the gates of the transistors Tr1$f$ and Tr2$f$. In the structural example shown in FIG. 1, the transistors Tr1f and Tr2f are formed by the P-type transistor; when the control signal Ctrl_SA is the low level, the bit lines BL1f and BL2f are coupled to the sense amplifier SAf, and when the control signal Ctrl_SA is the high level, the bit lines BL1f and BL2f are cut off from the sense amplifier SAf.

As shown in FIG. 1, the memory cells MC1 and MC2 arranged in the data area 11 and the memory cells MC1f and MC2f arranged in the flag area 12 are coupled to the same word line WL. Further, the transistors Tr1 and Tr2 arranged in the data area 11 and the transistors Tr1f and Tr2f arranged in the flag area 12 are coupled to the same signal line, and the same control signal Ctrl_SA is supplied to these transistors.

The same status flag is stored in the memory cells MC1f and MC2f arranged in the flag area 12. In other words, in the structural example shown in FIG. 1, the two memory cells MC1f and MC2f are defined as a pair and the same status flag is stored there. Here, the status flag is a flag indicating whether or not data is stored in the memory cells MC1 and MC2 in the data area 11. In short, the status flag is a flag indicating the data stored state of the memory cells MC1 and MC2 in the data area 11 which are coupled to the same word line WL as the memory cells MC1f and MC2f in the flag area 12.

Specifically, it is a flag indicating whether the memory cells MC1 and MC2 in the data area 11 coupled to the same word line WL are in the data written state or the data erased state. The data written state (writing state) is a state where data is stored or a state where data is effective. Similarly, the data erased state (erased state) is a state where data is not written or a state where data is ineffective.

In the embodiment, when the memory cells MC1 and MC2 in the data area 11 are both in the erased state (low threshold voltage state), the status flag value of "1" is stored in each of the memory cells MC1f and MC2f in the flag area 12. In this case, both the memory cells MC1f and MC2f are set into the low threshold voltage state. When the data is written in the memory cells MC1 and MC2 in the data is area 11, the status flag value of "0" is stored in each of the memory cells MC1f and MC2f within the flag area 12. In this case, both the memory cells MC1f and MC2f are set into the high threshold voltage state.

For example, in the embodiment, the memory cells MC1f and MC2f for storing the status flag may be provided for every erasure unit of the memory cells MC1 and MC2 in the data area 11. For example, when the erasure unit of the data area 11 is targeted for every memory cells MC1 and MC2 coupled to the same word line WL, the memory cells MC1f and MC2f for storing the status flag can be provided in every word line WL. Erasing operation of each memory cell in the data area 11 and the flag area 12 (specifically, the memory cells MC1, MC2, MC1f, and MC2f) may be performed at once.

In the embodiment, the data stored in the memory cells MC1f and MC2f within the flag area 12 is read out according to the reference read method.

FIG. 5 is a view for use in describing the structural example of the memory cells 16 arranged in the flag area 12 and the read operation. As shown in FIG. 5, the drain region D (refer to FIG. 2) in the memory cell MC1f is coupled to the bit line BL1f, the source region S is coupled to the source line SL, the control gate CG is coupled to the word line WL, and the memory gate MG is coupled to the memory gate select line MGL. The drain region D in the memory cell MC2f is coupled to the bit line BL2f, the source region S is coupled to the source line SL, the control gate CG is coupled to the word line WL, and the memory gate MG is coupled to the memory gate select line MGL.

The data stored in the memory cells MC1f and MC2f within the flag area 12 is read out according to a reference read method. Specifically, the respective bit lines BL1f and BL2f coupled to the respective memory cells MC1f and MC2f and the signal line IL are precharged to have each predetermined voltage. Then, with the word line WL turned into the high level, the voltages of the control gates in the memory cells MC1f and MC2f are turned into the high level. According to this, the currents depending on the threshold voltage state of the memory cells MC1f and MC2f flow in the memory cells MC1f and MC2f, to discharge the bit lines BL1f and BL2f. Further, the current flows to the reference current source Iref, to discharge the signal line IL. At a predetermined sense timing, the sense amplifier SAf is used to sense a voltage difference between the bit line BLf and the signal line IL. According to this, the data stored in the memory cells MC1f and MC2f can be detected. In short, the sense amplifier SAf can detect the value of the status flag by comparison between the total current of the respective currents flowing in the memory cells MC1f and MC2f and the reference current of the reference current source Iref.

Specifically, when the threshold voltages Vt1f and Vt2f of the memory cells MC1f and MC2f are both in the low threshold voltage state, the memory cells MC1f and MC2f are in a current easily flowing state. In this case, the voltage of the bit line BLf coupled to one input terminal of the sense amplifier gets lower than that of the signal line IL. Detecting the potential difference between the bit line BLf and the signal line IL, the sense amplifier SAf can determine that the data "1" is stored in the memory cells MC1f and MC2f.

On the contrary, when the threshold voltages Vt1f and Vt2f of the memory cells MC1f and MC2f are both in the high threshold voltage state, the memory cells MC1f and MC2f are in a current hardly flowing state. In this case, the voltage of the bit line BLf coupled to one input terminal of the sense amplifier gets higher than that of the signal line IL. Detecting the potential difference between the bit line BLf and the signal line IL, the sense amplifier SAf can determine that the data "0" is stored in the memory cells MC1f and MC2f.

FIG. 6 is a graph showing the I-V characteristics when reading the respective memory cells. FIG. 6 shows the threshold voltage Vt_a in the high threshold voltage state and the threshold voltage Vt_b in the low threshold voltage state, in one bit single cell (specifically, the memory cell MC1 shown in FIG. 4). Further, it shows the threshold voltage Vtf_a in the high threshold voltage state and the threshold voltage Vtf_b in the low threshold voltage state, in two bit parallel cells (specifically, the memory cell MC1f and the memory cell MC2f mutually coupled in parallel shown in FIG. 5).

In short, the threshold voltage Vt_a shown in FIG. 6 indicates the voltage value when a threshold defining current flows in the one bit single cell MC1 in the high threshold voltage state, and the threshold voltage Vt_b indicates the voltage value when the threshold defining current flows in the one bit single cell MC1 in the low threshold voltage state. Similarly, the threshold voltage Vtf_a shown in FIG. 6 indicates the voltage value when the threshold defining current flows in the two bit parallel cells (MC1f+MC2f) in the high threshold voltage state, and the threshold voltage Vtf_b indicates the voltage value when the threshold defining current flows in the two bit parallel cells in the low threshold voltage state.

FIG. 6 shows the case of not adjusting the initial threshold voltages of the respective memory cells MC1, MC1f, and MC2f, assuming that the respective memory cells MC1, MC1f, and MC2f have the substantially same initial threshold voltage.

As shown in FIG. 6, the threshold voltage Vtf_a of the two bit parallel cells (MC1f+MC2f) in the high threshold voltage state is lower than the threshold voltage Vt_a of the one bit single cell MC1 in the high threshold voltage state. Similarly, the threshold voltage Vtf_b of the two bit parallel cells (MC1f+MC2f) in the low threshold voltage state is lower than the threshold voltage Vt_b of one bit single cell MC1 in the low threshold voltage state.

According to this, the reason why the threshold voltages Vtf_a ad Vtf_b are reduced in the two bit parallel cells (MC1f+MC2f) is as follows. As shown in FIG. 5, the memory cell MC1f and the memory cell MC2f of the two bit parallel cells (MC1f+MC2f) are coupled to the sense amplifier SAf in parallel. Specifically, the bit line BL1f coupled to the memory cell MC1f and the bit line BL2f coupled to the memory cell MC2f are coupled to the sense amplifier SAf in parallel through the bit line BLf.

According to this, the current drawn from the bit line BL1f and the current drawn from the bit line BL2f flow in the bit line BLf coupled to the sense amplifier SAf, and therefore, the current detected by the sense amplifier SAf is reduced. In other words, although the currents flowing in the respective memory cell MC1f and the memory cell MC2f are the same as the current flowing in the one bit single cell MC1, the memory cell MC1f and the memory cell MC2f are coupled to each other in parallel; therefore, the current drawn from the bit line BLf coupled to the sense amplifier SAf is twice of the current in the case of the one bit single cell MC1. As the result, the threshold voltage is reduced apparently in the two bit parallel cells (MC1f+MC2f), compared with the case of the one bit single cell MC1.

In the semiconductor memory device according to the embodiment, the threshold voltage reduction in the two bit parallel cells (MC1f+MC2f) is restricted apparently, hence to previously adjust the threshold voltages of the memory cells MC1f and MC2f arranged in the flag area 12. Concretely, the initial threshold voltages of the memory cells MC1f and MC2f arranged in the flag area 12 are adjusted to be higher than the initial threshold voltages of the memory cells MC1 and MC2 arranged in the data area 11.

FIG. 7 is a graph showing the I-V property when reading the respective memory cells, specifically showing the I-V property when adjusting the initial threshold voltages of the memory cells MC1f and MC2f arranged in the flag area 12.

As mentioned above, in the semiconductor memory device according to the embodiment, the initial threshold voltages of the memory cells MC1f and MC2f arranged in the flag area 12 are adjusted to be higher than the initial threshold voltages of the memory cells MC1 and MC2 arranged in the data area 11. By adjusting the initial threshold voltages as mentioned above, the currents flowing in the memory cells MC1f and MC2f arranged in the flag area 12 can be reduced than the currents flowing in the memory cells MC1 and MC2 in the data area 11.

As shown in FIG. 5, in the two bit parallel cells (MC1f+MC2f), the current drawn from the bit line BL1f and the current drawn from the bit line BL2f flow in the bit line BLf coupled to the sense amplifier SAf; when the initial threshold voltages are adjusted, the currents flowing in the respective memory cells MC1f and MC2f can be reduced. Accordingly, the current drawn from the bit line BL1f and the current drawn from the bit line BL2f can be reduced, and the current flowing in the bit line BLf coupled to the sense amplifier SAf can be reduced. As the result, the apparent threshold voltage in the two bit parallel cells (MC1f+MC2f) can be increased.

At this point, by making the current flowing in the bit line BLf coupled to the sense amplifier SAf equal to the current flowing in the one bit single cell MC1, the threshold voltages Vtf_a and Vt_b in the two bit parallel cells (MC1f+MC2f) can be substantially identical to the threshold voltages Vt_a and Vt_b in the one bit single cell MC1 (refer to FIG. 7).

FIG. 8 is a view showing another structural example of the plural memory cells arranged in the flag area. FIG. 8 shows the case where a memory cell 17 arranged in the flag area 12 consists of four memory cells MC1f to MC4f (quad cells). In the structure shown in FIG. 8, the four memory cells MC1f to MC4f are defined as a set, to store the same status flag.

As shown in FIG. 8, the respective drain regions D (refer to FIG. 2) of the respective memory cells MC1f to MC4f are coupled to the respective bit lines BL1f to BL4f. The respective source regions S of the respective memory cells MC1f to MC4f are coupled to the source line SL, the respective control gates CG are coupled to the word line WL, and the respective memory gates MG are coupled to the memory gate select line MGL.

The bit line BLf with the memory cells MC1f to MC4f coupled in parallel is coupled to one input terminal of the sense amplifier SAf, and the reference current source Iref is coupled to the other input terminal. The respective bit lines BL1f to BL4f are coupled to the bit line BLf through the respective transistors Tr1f to Tr4f. The control signal Ctrl_SA for controlling the connection between the bit lines BL1f to BL4f to the sense amplifier SAf is supplied to the gates of the transistors Tr1f to Tr4f.

The same status flag is stored in each of the memory cells MC1f to MC4f in the flag area 12. Further, the data stored in the memory cells MC1f to MC4f in the flag area 12 is read out according to the reference read method. Specifically, at first, the bit lines BL1f to BL4f respectively coupled to the memory cells MC1f to MC4f and the signal line IL are precharged to have each predetermined voltage. Then, with the word line WL turned into the high level, the voltages of the control gates in the memory cells MC1f to MC4f are turned into the high level. According to this, the currents depending on the threshold voltage state in the memory cells MC1f to MC4f flow in the memory cells MC1f to MC4f, to discharge the bit lines BL1f to BL4f. Further, the current flows in the reference current source Iref, to discharge the signal line IL. At a predetermined sense timing, a voltage difference between the bit line BLf and the signal line IL is sensed by the sense amplifier SAf. According to this, the data stored in the memory cells MC1f to MC4f can be detected. In short, the sense amplifier SAf detects the value of the status flag, by comparison between the total currents flowing in the respective memory cells MC1f to MC4f and the reference current in the reference current source Iref.

Specifically, when the threshold voltages Vt1f to Vt4f of the memory cells MC1f to MC4f are both in the low threshold voltage state, the currents easily flow in the memory cells MC1f to MC4f. In this case, the voltage of the bit line BLf coupled to one input terminal of the sense amplifier gets lower than the voltage of the signal line IL. Detecting the potential difference between the bit line BLf and the signal line IL, the sense amplifier SAf can determine that the data "1" is stored in the memory cells MC1f to MC4f.

On the contrary, when the threshold voltages Vt1$f$ to Vt4$f$ of the memory cells MC1$f$ to MC4$f$ are both in the high threshold voltage state, the currents hardly flow in the memory cells MC1$f$ to MC4$f$. In this case, the voltage of the bit line BLf coupled to one input terminal of the sense amplifier gets higher than the voltage of the signal line IL. Detecting the potential difference between the bit line BLf and the signal line IL, the sense amplifier SAf can determine that the data "0" is stored in the memory cells MC1$f$ to MC4$f$.

In the structure shown in FIG. 5, the two memory cells MC1$f$ and MC2$f$ are defined as a set, to store the same status flag; while, in the structure shown in FIG. 8, the four memory cells MC1$f$ to MC4$f$ are defined as a set, to store the same status flag. In the structure shown in FIG. 8, the number of the memory cells coupled to the sense amplifier SAf in parallel is more than in the structure shown in FIG. 5 and therefore, the current flowing in each one memory cell can be reduced. In short, the threshold voltages of the respective memory cells MC1$f$ to MC4$f$ can be increased.

The structures shown in FIGS. 5 and 8 are only examples and in the semiconductor memory device according to the embodiment, the number of the memory cells defined as a set to store the same status flag is not restricted particularly but can be defined at any number.

FIG. 9 is a view showing the whole structure of the semiconductor memory device according to the embodiment. As shown in FIG. 9, in the semiconductor memory device 1 according to the embodiment, the memory array 10 has a plurality of word lines WL extending horizontally and a plurality of bit lines extending vertically, in a manner of crossing each other at right angle. Each memory cell is arranged at an intersection of each word line WL and each bit line BL. The memory array 10 includes the data area 11 and the flag area 12, and the flag area 12 is provided on the side of the end portion in the extending direction of the word line WL in the memory array 10.

In the semiconductor memory device 1 according to the embodiment, the initial threshold voltages of the memory cells MC1$f$ and MC2$f$ arranged in the flag area 12 are adjusted to be higher than the initial threshold voltages of the memory cells MC1 and MC2 arranged in the data area 11. For example, at a manufacturing time of the semiconductor memory device 1, by additionally performing doping in the flag area 12, the initial threshold voltages of the memory cells MC1$f$ and MC2$f$ in the flag area 12 can be increased. Further, when the memory cell in the flag area 12 is formed by a metal gate, the ratio of the material forming the metal gate can be changed, to increase the initial threshold voltages of the memory cells MC1$f$ and MC2$f$ in the flag area 12.

As mentioned above, in the semiconductor memory device according to the embodiment, the initial threshold voltages of the memory cells MC1$f$ and MC2$f$ arranged in the flag area 12 are adjusted to be higher than the initial threshold voltages of the memory cells MC1 and MC2 arranged in the data area 11. Accordingly, in the semiconductor memory device having the data area 11 and the flag area 12, the initial threshold voltages of the respective memory areas can be optimized.

In the flag area 12, when the two memory cells MC1$f$ and MC2$f$ (twin cells) are used to be coupled in parallel, and when the four memory cells MC1$f$ to MC4$f$ (quad cells) are used to be coupled in parallel, the actual cell width W is large, and therefore, considering the electric charge, a fluctuation of the threshold voltage is smaller, which can reduce the damage to the respective memory cells. The invention can improve the reliability more than in the case where only one memory cell is used to store the status flag. Further, by using the memory cells coupled in parallel, the actual cell width W can be enlarged and the scattering of the memory cells can be improved; as the result, the window width can be properly set.

Second Embodiment

Next, a second embodiment will be described.

FIG. 10 is a view showing the whole structure of a semiconductor memory device according to a second embodiment. As shown in FIG. 10, in a memory array 30 of a semiconductor memory device 2 according to the second embodiment, a plurality of word lines WL extending in a horizontal direction and a plurality of bit lines extending in a vertical direction are arranged in a manner of mutually crossing each other. Each memory cell is arranged at the intersection of each word line WL and each bit line BL. The memory array 30 includes a data area 31 and an extra area 32, and the extra area 32 is provided on a side of the end portion (lower portion) in the extending direction of the bit line BL in the memory array 30.

Data is stored in the data area 31. The information for operating the data area 31, in short, the information necessary for staring the data area 31 is stored in the extra area 32. For example, a trimming code is stored in the extra area 32, as the information for operating the data area 31.

Further, the memory cells where the data is read respectively according to the complementary read method and the reference read method are arranged respectively in the data area 31 and the extra area 32. The structure and the operation of the memory cells is the same as having been described in the first embodiment (particularly, refer to FIG. 4).

In the semiconductor memory device 2 according to the embodiment, the extra area 32 is a special memory area. Concretely, in the semiconductor memory device 2 according to the embodiment, the initial threshold voltages of the memory cells arranged in the extra area 32 are adjusted to be higher than those of the memory cells arranged in the data area 32. According to this, the initial threshold voltage in the extra area 32 can be optimized and at the same time, the reliability of the data stored in the extra area 32 can be improved. Hereinafter, the above reason will be described in detail.

As mentioned above, the extra area 32 stores the information for operating the data area 31 (the trimming code and the like). Here, the timing of reading the trimming code from the extra area 32 is before performing trimming on the semiconductor memory device; therefore, in reading the trimming code from the extra area 32, the reading voltage for reading the trimming code is not optimized. In writing the data (trimming code) in the extra area 32, a margin has to be provided for a fluctuation of the reading voltage and the like.

Further, in manufacturing the semiconductor memory device, the trimming code is written in the extra area 32 during the wafer test; therefore, a retention resistance to heat is required in the packaging process thereafter and the solder reflow process in the mounting.

FIG. 11 is a graph showing a relation between the retention time and Vt of the memory cell when the memory cell is left under the environment of 160° C. As shown in FIG. 11, when the number of the data rewriting times is less like in the extra area 32, the fluctuation of the threshold voltage of the memory cell on the side of the high threshold voltage gets larger than that of the threshold voltage of the memory cell on the side of the low threshold voltage.

According to this, taking note to the retention time t1, a difference ΔVt2 between the threshold voltage of the memory cell on the side of the high threshold voltage and the threshold voltage of the reading limit gets smaller than a difference ΔVt1 between the threshold voltage of the memory cell on the side of the low threshold voltage and the threshold voltage of the reading limit. Accordingly, on the side of the high threshold voltage, the window width gets narrower than on the side of the low threshold voltage, and the window width of the threshold voltage of the memory cell is deteriorated in balance.

In the semiconductor memory device 2 according to the embodiment, considering the above, the initial threshold voltages of the memory cells arranged in the extra area 32 are adjusted to be higher than the initial threshold voltages of the memory cells arranged in the data area 32. According to this, the threshold voltage of the memory cell on the side of the high threshold voltage and the threshold voltage of the memory cell on the side of the low threshold voltage shown in FIG. 11 are shifted to the high voltage side (upward), hence to improve the balance of the window width of the threshold voltage of the memory cell. As the result, the initial threshold voltage in the extra area 32 can be optimized and the reliability of the data stored in the extra area 32 can be improved.

For example, in manufacturing the semiconductor memory device 2 shown in FIG. 10, by additionally performing the doping in the extra area 32, the initial threshold voltages of the memory cells in the extra area 32 can be increased. Further, when each memory cell in the extra area 32 is formed by a metal gate, the ratio of the material forming the metal gate may be changed, to increase the initial threshold voltages of the memory cells in the extra area 32.

FIG. 12 is a block diagram showing an example of mounting the semiconductor memory devices according to the first and the second embodiments. FIG. 12 shows the structural example with the semiconductor memory devices 1 and 2 according to the first and the second embodiments mounted in a semiconductor device 50.

As shown in FIG. 12, the semiconductor memory devices 1 and 2, a Central Processing Unit (CPU) 51, a Random Access Memory (RAM) 52, and an analog circuit 53 are mounted in the semiconductor device 50. The CPU 51 is a circuit of performing various operations in the semiconductor device 50. The RAM 52 is a storing device capable of temporarily storing predetermined data. The analog circuit 53 is a circuit of performing various types of analog processing in the semiconductor device 50. The semiconductor memory devices 1 and 2 are flash memories in which programs executed by the CPU 51 and data are stored.

As shown in FIG. 12, the semiconductor memory device 1 is the semiconductor memory device 1 having been described in the first embodiment, and the memory array 10 includes the data area 11 and the flag area 12. The semiconductor memory device 2 is the semiconductor memory device 2 having been described in the second embodiment, and the memory array 30 includes the data area 31 and the extra area 32.

The example of mounting the semiconductor memory devices 1 and 2 shown in FIG. 12 is only one example and the semiconductor memory devices 1 and 2 according to the first and the second embodiments may be mounted in the semiconductor device in another structure than this.

As set forth hereinabove, the invention made by the inventor et al. has been described specifically based on the embodiments; the invention is not restricted to the above embodiments but needless to say, various modifications are possible without departing from its spirit.

What is claimed is:

1. A semiconductor memory device comprising:
a first memory area for storing data; and
a second memory area for storing information related to the data,
wherein initial threshold voltages of memory cells arranged in the second memory area is higher than initial threshold voltages of memory cells arranged in the first memory area.

2. The device according to claim 1,
wherein a pair of memory cells from which data is read according to a complementary read method is arranged in the first memory area, and
wherein a plurality of memory cells from which data is read according to a reference read method is arranged in the second memory area.

3. The device according to claim 2,
wherein the memory cells arranged in the second memory area are formed to store a status flag indicating a state of the data stored in the first memory area as the information related to the first memory area, and
wherein the same status flag is stored in the memory cells arranged in the second memory area.

4. The device according to claim 2,
wherein a first sense amplifier is arranged in the first memory area,
wherein a second sense amplifier is arranged in the second memory area,
wherein bit lines coupled to respective memory cells in the memory cell pair is coupled to input terminals of the first sense amplifier so that the bit lines are coupled to the input terminals, respectively, and
wherein a bit line of the memory cells coupled in parallel is coupled to one input terminal of the second sense amplifier and a reference current source is coupled to the other input terminal of the second sense amplifier.

5. The device according to claim 4,
wherein the second sense amplifier compares a total current of respective currents flowing in the memory cells with a reference current of the reference current source to detect a value of a status flag, and
wherein the status flag is stored in the memory cells arranged in the second memory area and indicates a state of the data stored in the first memory area as the information related to the first memory area.

6. The device according to claim 3,
wherein the respective memory cells arranged in the first and the second memory areas are coupled to the same word line, and
wherein the memory cells arranged in the second memory area coupled to the same word line store the status flag indicating the state of the data of the memory cell pair in the first memory area coupled to the same word line as the above memory cells.

7. The device according to claim 6, wherein an erasing operation is performed at once on each of the memory cells arranged in the first and the second memory areas coupled to the same word line.

8. The device according to claim 1, wherein information for operating the first memory area is stored in the second memory area, as the information related to the first memory area.

9. The device according to claim 8, wherein the second memory area is an extra area and a trimming code for operating the first memory area is stored in the second memory area.

10. The device according to claim 8, wherein the second memory area is provided on a side of an end portion of the device in an extending direction of bit lines to which respective memory cells are coupled.

11. The device according to claim 1, wherein doping is performed on the memory cells arranged in the second memory area, hence to make the initial threshold voltages of the memory cells arranged in the second memory area higher than the initial threshold voltages of the memory cells arranged in the first memory area.

12. The device according to claim 1, wherein the initial threshold voltages of the memory cells arranged in the second memory area shift both of a first threshold voltage of a high voltage side and a second threshold voltage side of a low voltage side to the high voltage side.

* * * * *